(12) United States Patent
Hoshino (10) Patent No.: US 11,754,932 B2
(45) Date of Patent: Sep. 12, 2023

(54) CONTROL METHOD OF DRIVING APPARATUS, DRIVING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Hayato Hoshino, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/856,018

(22) Filed: Jul. 1, 2022

(65) Prior Publication Data

US 2023/0011753 A1    Jan. 12, 2023

(30) Foreign Application Priority Data

Jul. 7, 2021  (JP) .................................. 2021-113134

(51) Int. Cl.
*G03F 7/20* (2006.01)
*G03F 7/00* (2006.01)
*H02P 25/064* (2016.01)

(52) U.S. Cl.
CPC ...... *G03F 7/70758* (2013.01); *G03F 7/70716* (2013.01); *H02P 25/064* (2016.02)

(58) Field of Classification Search
CPC .............. G03F 7/70716; G03F 7/70725; G03F 7/70758; H02P 25/064
See application file for complete search history.

(56) References Cited

U.S. PATENT DOCUMENTS

| 6,573,623 B2 * | 6/2003 | Tsuboi ................. H02K 41/031 310/12.24 |
| 6,590,355 B1 * | 7/2003 | Kikuchi ................. H02K 41/03 310/12.21 |
| 2002/0018195 A1 | 2/2002 | Iwamoto et al. |
| 2007/0279614 A1 | 12/2007 | Niwatsukino |

FOREIGN PATENT DOCUMENTS

| JP | H09-019178 A | 1/1997 |
| JP | 2006-067761 A | 3/2006 |

OTHER PUBLICATIONS

Extended European Search Report issued in corresponding EP Patent Application No. 22181193.8, dated Dec. 8, 2022, pp. 1-8.

* cited by examiner

*Primary Examiner* — Peter B Kim
(74) *Attorney, Agent, or Firm* — Carter, DeLuca & Farrell LLP (57) ABSTRACT

The present invention provides a control method of a driving apparatus that repeatedly performs a process of driving a target object in a predetermined range by a linear motor, wherein the linear motor includes a stator in which a plurality of coils are arrayed, and a mover provided with the target object, the control method comprising: changing a position of the stator with respect to the predetermined range at an arbitrary timing; and determining, in accordance with the changed position of the stator, output ratios of the plurality of coils in the process.

7 Claims, 8 Drawing Sheets

CONTROL METHOD OF DRIVING APPARATUS, DRIVING APPARATUS, LITHOGRAPHY APPARATUS, AND METHOD OF MANUFACTURING ARTICLE

BACKGROUND OF THE INVENTION

Field of the Invention

The present invention relates to a control method of a driving apparatus, the driving apparatus, a lithography apparatus, and a method of manufacturing an article.

Description of the Related Art

As a lithography apparatus used in manufacturing semiconductor devices or the like, a lithography apparatus is known that uses, as a driving apparatus which drives a stage holding an original and/or a substrate or the like, a multi-phase linear motor that selectively switches the coil to be energized in accordance with the position of a mover. Japanese Patent Laid-Open No. 9-19178 proposes, as a method of controlling the driving current of the multi-phase linear motor, a multi-phase excitation driving type that utilizes the principle of $\sin^2(x)+\cos^2(x)=1$. When driving the stage, the multi-phase excitation driving type linear motor simultaneously applies, to the coils of two phases whose phase angles of the magnetic flux densities are separated by 90°, currents corresponding to the respective magnetic flux densities (performs two-phase excitation). With this, it is possible to obtain a constant thrust with reduced thrust unevenness.

In the multi-phase linear motor as described above, when accelerating the stage, a current may be applied only to the coil of one phase out of the coils of two phases. In this case, the power load is concentrated only on the coil of one phase, and this leads to a remarkable temperature rise. Accordingly, the heat generation of the coil locally increases, and a performance deterioration or a reduction in life of the linear motor can occur. Japanese Patent Laid-Open No. 2006-67761 proposes a method of positioning a stator such that the electrical phase angle of the linear motor upon accelerating or decelerating a driven object is set in a predetermined state (for example, such that the phase angle and current are uniform between the coils of two phases).

In the method described in Japanese Patent Laid-Open No. 2006-67761, for example, when the stator is positioned such that the phase angles of the coils of two phases become uniform at the acceleration point of the driven object, the power loads on the coils may be biased at the deceleration point of the driven object. That is, the method described in Japanese Patent Laid-Open No. 2006-67761 does not sufficiently reduce the bias of the power loads on the coils at both the acceleration point and the deceleration point to reduce the local deterioration in the stator.

SUMMARY OF THE INVENTION

The present invention provides, for example, a technique advantageous in reducing a local deterioration in the stator of a linear motor.

According to one aspect of the present invention, there is provided a control method of a driving apparatus that repeatedly performs a process of driving a target object in a predetermined range by a linear motor, wherein the linear motor includes a stator in which a plurality of coils are arrayed, and a mover provided with the target object, the control method comprising: changing a position of the stator with respect to the predetermined range at an arbitrary timing; and determining, in accordance with the changed position of the stator, output ratios of the plurality of coils in the process.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In each embodiment described below, an example will be described in which the driving apparatus and the control method thereof according to the present invention are applied to an exposure apparatus that exposes a substrate to transfer the pattern of an original (mask) onto the substrate. However, the present invention is not limited to this. The driving apparatus and the control method thereof according to the present invention are also applicable to another lithography apparatus such as an imprint apparatus that forms a pattern of an imprint material on a substrate using a mold. Further, the driving apparatus and the control method thereof according to the present invention are applicable not only to the lithography apparatus but also to an apparatus that performs a driving process of a target object (object to be driven).

First Embodiment

Figure 1:
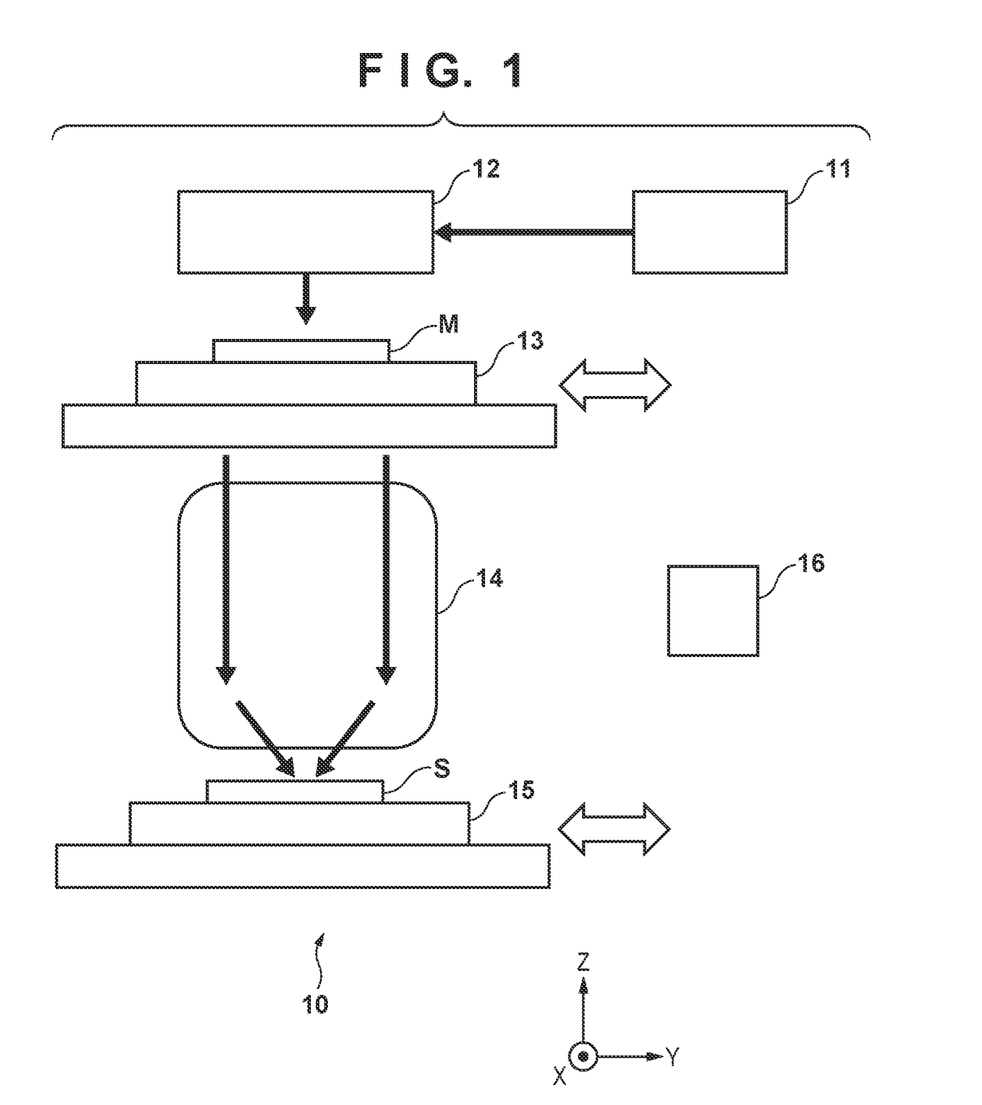
FIG. 1 is a schematic view showing an arrangement example of an exposure apparatus.

The first embodiment according to the present invention will be described. FIG. 1 is a schematic view showing an arrangement example of an exposure apparatus 10 of this embodiment. The exposure apparatus 10 of this embodiment can include, for example, an illumination optical system 12, an original stage 13 that can move while holding an original M such as a mask, a projection optical system 14, a substrate stage 15 that can move while holding a substrate S such as a wafer, and a controller 16. The controller 16 is formed by, for example, a computer including a CPU (Central Processing Unit), a memory, and the like, and controls an exposure process of the substrate S by controlling the respective units of the exposure apparatus 10. Note that in the following description, a step-and-scan exposure apparatus (so-called scanning exposure apparatus) will be illustrated and described as the exposure apparatus 10.

The illumination optical system 12 shapes light emitted from a light source 11 into, for example, band-like or arcuate slit-shaped light, and illuminates a portion of the original M with this slit-shaped light. The light transmitted through the portion of the original M enters the projection optical system 14 as pattern light reflecting the pattern of the portion of the original M. The projection optical system 14 has a predetermined projection magnification, and projects the pattern image of the original M onto the substrate S (more specifically, the resist on the substrate) by using the pattern light. The original M and the substrate S are held by the original stage 13 and the substrate stage 15, respectively, and are arranged in optically conjugate positions (the object plane and image plane of the projection optical system 14) via the projection optical system 14. The controller 16 relatively scans, in a predetermined scanning direction, the original stage 13 and substrate stage 15 in synchronism with each other at a velocity ratio matching the projection magnification of the projection optical system 14. With this, an exposure process of exposing the substrate S to transfer the pattern of the original M onto the substrate can be performed. The exposure process can be performed on each of a plurality of shot regions in the substrate.

Figure 2:
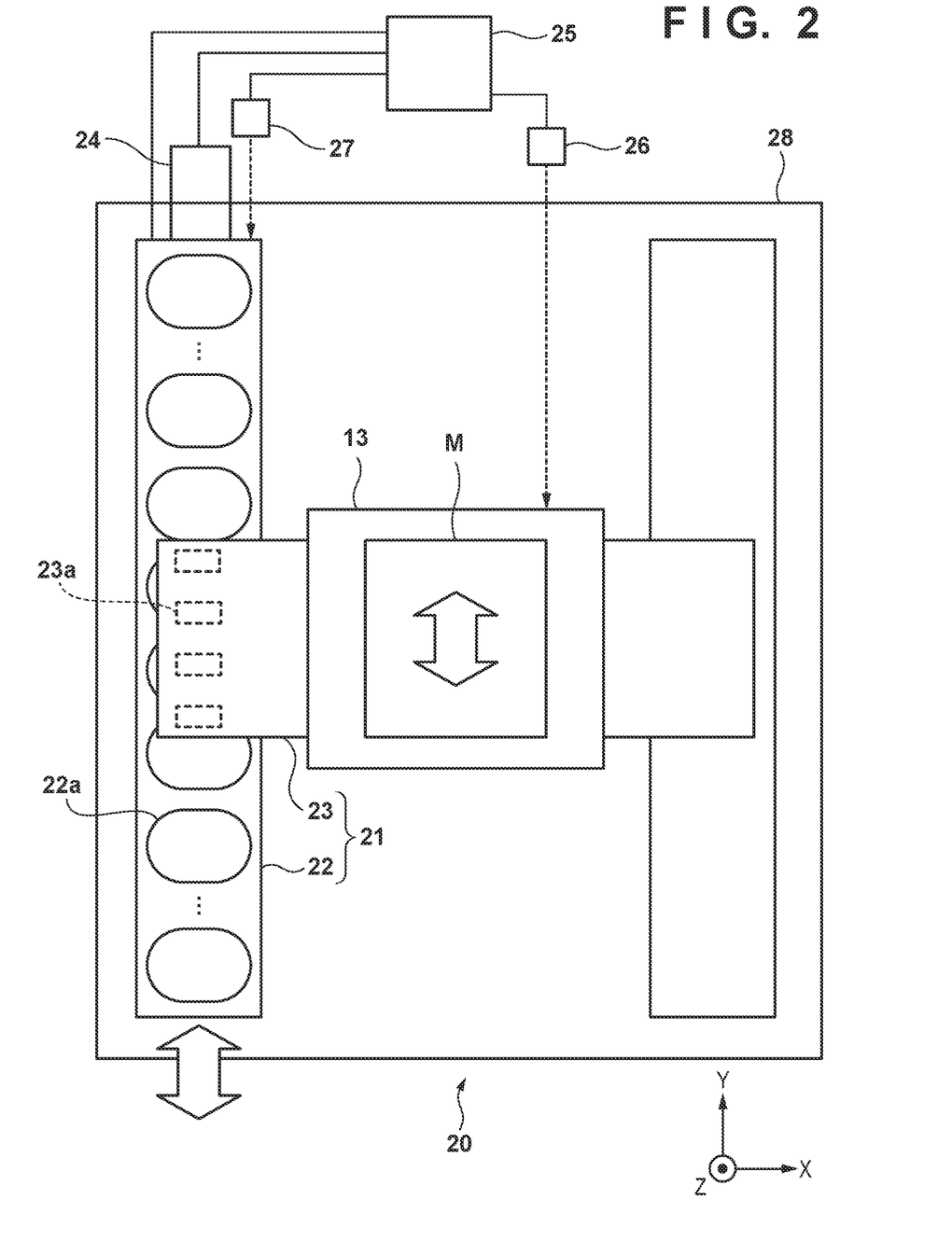
FIG. 2 is a schematic view showing an arrangement example of a driving apparatus.

The original stage 13 and the substrate stage 15 are driven by a driving apparatus 20. FIG. 2 is a schematic view showing an arrangement example of the driving apparatus 20 of this embodiment, and shows an example in which the original stage 13 is driven as a target object to be driven. In FIG. 2, the original stage 13 is levitated from a stage base 28 at a minute interval by a gas bearing (not shown), and is driven in the Y-axis direction by a linear motor 21 to be described later. Note that since the arrangement in the right half of FIG. 2 is similar to the arrangement in the left half, an illustration thereof is omitted. The driving apparatus 20 may be used to drive the substrate stage 15 in addition to the original stage 13.

As shown in FIG. 2, the driving apparatus 20 of this embodiment includes the linear motor 21 and a controller 25. The linear motor 21 can include a stator 22 in which a plurality of coils 22a are arrayed along the driving direction (Y-axis direction in FIG. 2) of the original stage 13, and a mover 23 provided with the original stage 13. The controller 25 is formed by, for example, a computer including a CPU, a memory, and the like, and controls energization of the stator 22 (the plurality of coils 22a) of the linear motor 21 to control driving of the substrate stage 15 by the linear motor 21. The controller 25 may be formed as a part of the controller 16 of the exposure apparatus 10 described above, or may be formed as a separate body from the controller 16. Here, the position of the original stage 13 in the Y-axis direction can be measured by a laser interferometer 26, and the position of the stator 22 in the Y-axis direction can be measured by a laser interferometer 27. The controller 25 can control the position of the original stage 13 in the Y-axis direction based on the measurement result of the laser interferometer 26, and control the position of the stator 22 in the Y-axis direction based on the measurement result of the laser interferometer 27.

Figure 3:
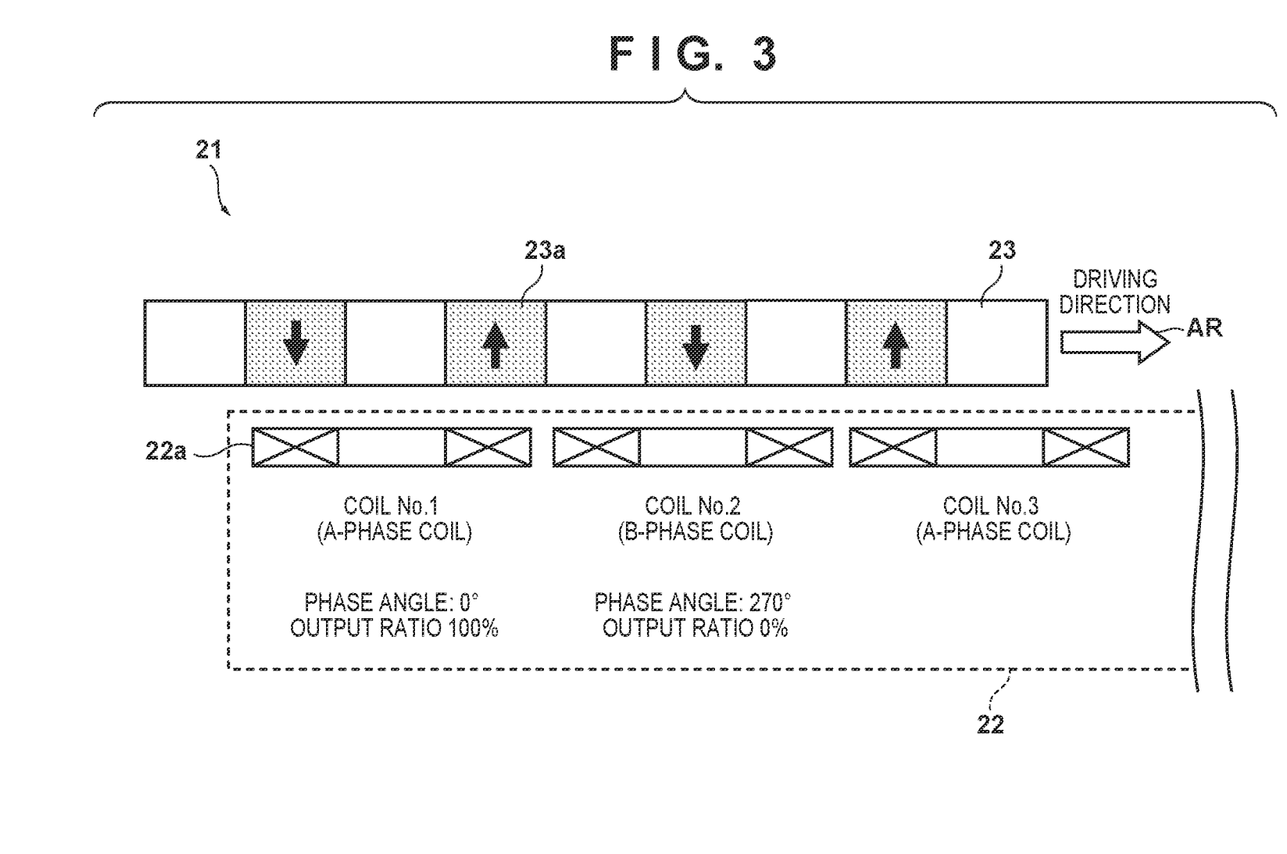
FIG. 3 is a schematic view showing an arrangement example of a part of a multi-phase linear motor.

The linear motor 21 in the driving apparatus 20 of this embodiment can be formed as a multi-phase excitation driving type linear motor (to be sometimes described as the multi-phase linear motor 21 hereinafter). FIG. 3 shows an arrangement example of apart of the multi-phase linear motor 21. In the multi-phase linear motor 21, the plurality of coils 22a in the stator 22 are arranged by alternately arranging the A-phase (first phase) coil and the B-phase (second phase) coil. The mover 23 includes a plurality of permanent magnets 23a arranged in the Halbach array which forms a magnetic flux density waveform. The plurality of permanent magnets 23a are arrayed along the array direction of the plurality of coils 22a in the stator 22. A current corresponding to the phase angle decided by the relative position between the plurality of coils 22a of the stator 22 and the permanent magnet 23a of the mover 23 is supplied to the plurality of coils 22a.

Figure 4:
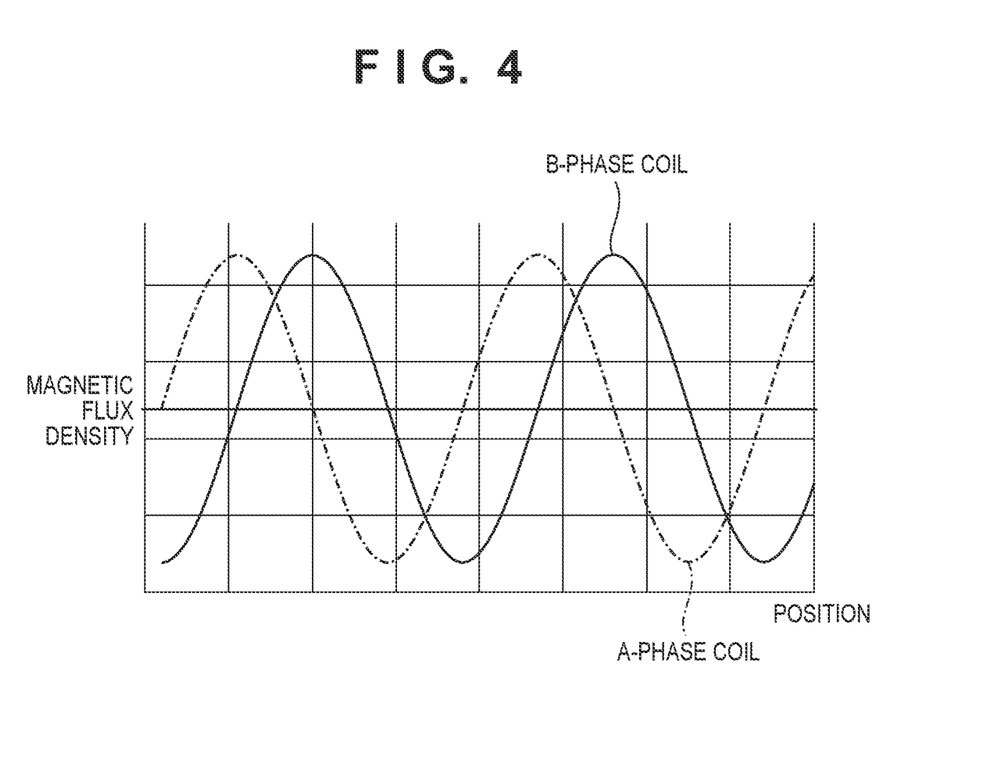
FIG. 4 is a graph showing an example of the magnetic flux density distribution passing through the coils of respective phases with respect to the position of the mover in the multi-phase linear motor.

FIG. 4 shows an example of the magnetic flux density distribution passing through the coils of respective phases with respect to the position of the mover 23 in the multi-phase linear motor 21. When the position of the mover 23 is indicated by X, and the magnetic flux density passing through the A-phase coil is represented by $\cos(X)$, a current proportional to $\cos(X)$ is supplied to the A-phase coil. On the other hand, the magnetic flux density passing through the B-phase coil, in which the phase angle of the magnetic flux density is shifted 90° with respect to that of the A-phase coil, is represented by $\sin(X)$. Accordingly, a current proportional to $\sin(X)$ is supplied to the B-phase coil. With this arrangement, a thrust force caused by the Lorentz force can be generated in the multi-phase linear motor 21, and the mover 23 can be driven with respect to the stator 22 in the driving direction indicated by an arrow AR in FIG. 3.

Figure 5:
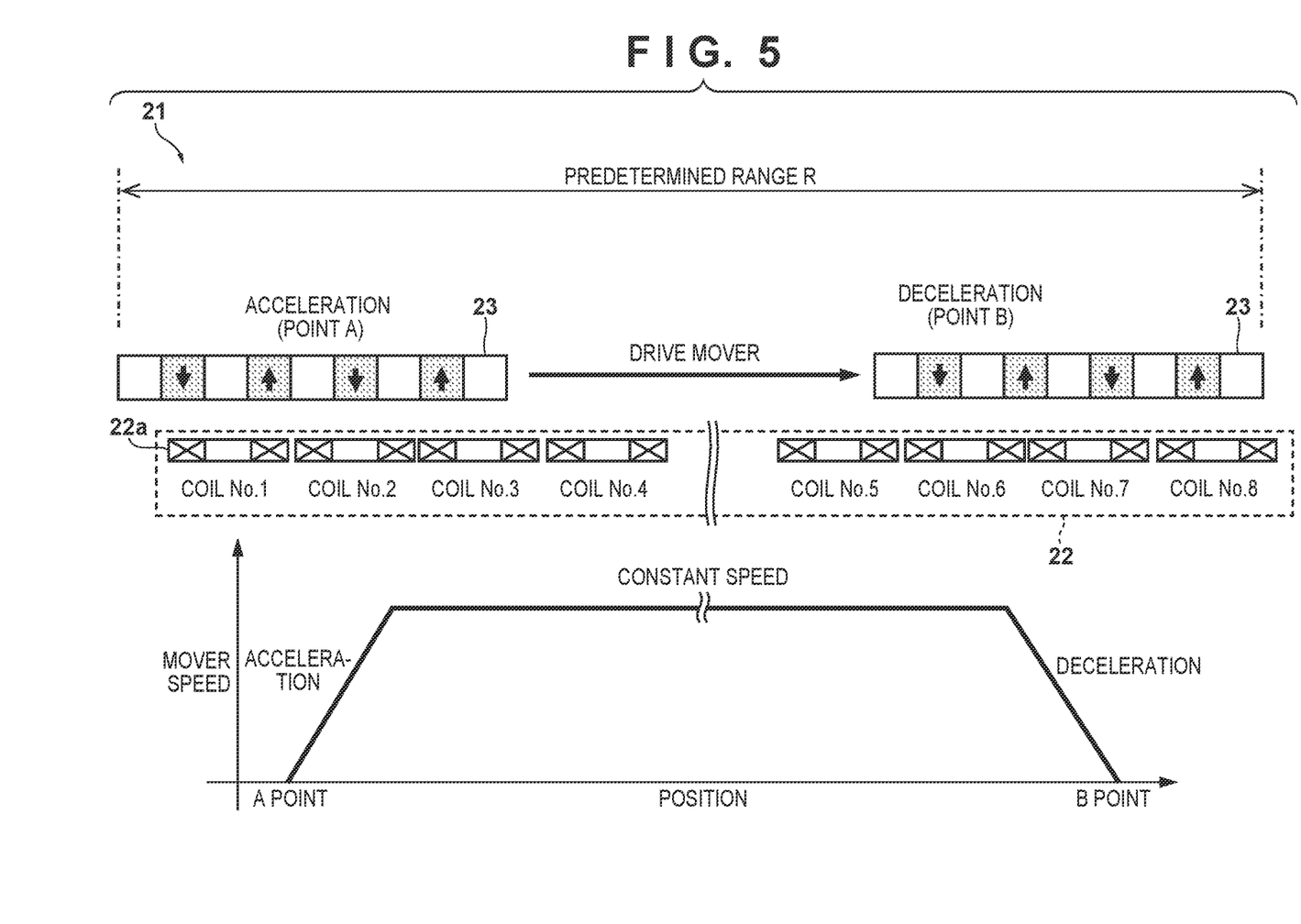
FIG. 5 is a view showing an example of driving the mover in a predetermined range in the multi-phase linear motor.

The driving apparatus 20 described above repeatedly performs, for each exposure process, a driving process of driving the original stage 13 in a predetermined range R by the multi-phase linear motor 21. In one driving process, for example, when driving the mover 23 in the predetermined range R from the point A to the point B as shown in FIG. 5, a current can be supplied to the coil 22a of the stator 22 at the point A where the mover 23 is accelerated and the point B where the mover 23 is decelerated. Here, the point A may be understood as the acceleration point (acceleration section) where the mover 23 is accelerated, and the point B may be understood as the deceleration point (deceleration section) where the mover 23 is decelerated. Further, the predetermined range R is the driving range of the original stage 13 set in advance to drive the original stage 13 in scanning exposure, and may be understood as the driving range of the mover 23 in the multi-phase linear motor 21.

When repeatedly performing the driving process of driving the original stage 13 (mover 23) in the predetermined range R as described above, a current load is generated in the coil 22a, among the plurality of coils 22a in the stator 22, at each of the acceleration point and the deceleration point, and this can increase deterioration of this coil 22a. To prevent this, the driving apparatus 20 of this embodiment includes a moving mechanism 24 (see FIG. 3) that moves the stator 22 in the driving direction (Y-axis direction) of the mover 23. At an arbitrary timing (predetermined timing), the position of the stator 22 with respect to the predetermined range R is changed by the moving mechanism 24. In accordance with the change of the position of the stator 22, the output ratios of the plurality of coils 22a in the driving process after the arbitrary timing are determined so as to be changed with respect to the output ratios of the plurality of coils 22a before the arbitrary timing. With the process (to be sometimes referred to as the moving process of the stator 22 hereinafter) as described above, it is possible to reduce the bias of the current load on the coil 22a at the acceleration point and/or the deceleration point, and reduce the local deterioration in the stator 22 (the plurality of coils 22a).

The moving mechanism 24 includes, for example, an electric actuator, and can move the stator 22 under the control of the controller 25. In this case, when the controller 25 supplies a signal to the moving mechanism 24 at an arbitrary timing, the position of the stator 22 with respect to the predetermined range R can be automatically changed. Alternatively, the moving mechanism 24 may include, for example, a manual actuator such as a ball screw. In this case, when an operator operates the moving mechanism 24 at an arbitrary timing, the position of the stator 22 with respect to the predetermine range R can be manually changed. Note that in the following description, an example will be described in which an electric actuator is provided in the moving mechanism 24 and the moving mechanism 24 is controlled by the controller 25.

Here, the arbitrary timing can be, for example, a timing in a period between a plurality of driving processes (exposure processes). The arbitrary timing may also be a timing at which the number of driving operations of the original stage 13 serving as the target object to be driven (this may be understood as the number of exposure processes) reaches a preset threshold value. Further, the arbitrary timing may be a timing at which the value of each of various kinds of sensors provided in the driving apparatus 20 (exposure apparatus 10), for example, the value detected by a temperature sensor and/or a pressure sensor reaches a preset threshold value. The value of each of the various kinds of sensors can include, for example, the temperature of the linear motor 21 detected by the temperature sensor and/or the internal pressure of the exposure apparatus 10 detected by the pressure sensor. The arbitrary timing may be a timing at which the electric characteristic of at least one coil of the plurality of coils 22a in the stator 22 reaches a preset threshold value. The electric characteristic can include at least one of the resistance value, the voltage value, the current value, and the inductance value of the coil. The arbitrary timing may be a timing at which the difference between the measurement value indicating the driving state of the original stage 13 and a target value (set value) reaches a preset threshold value. The driving state can include at least one of the velocity, the acceleration, and the position of the original stage 13 in the driving process.

Figure 6A:
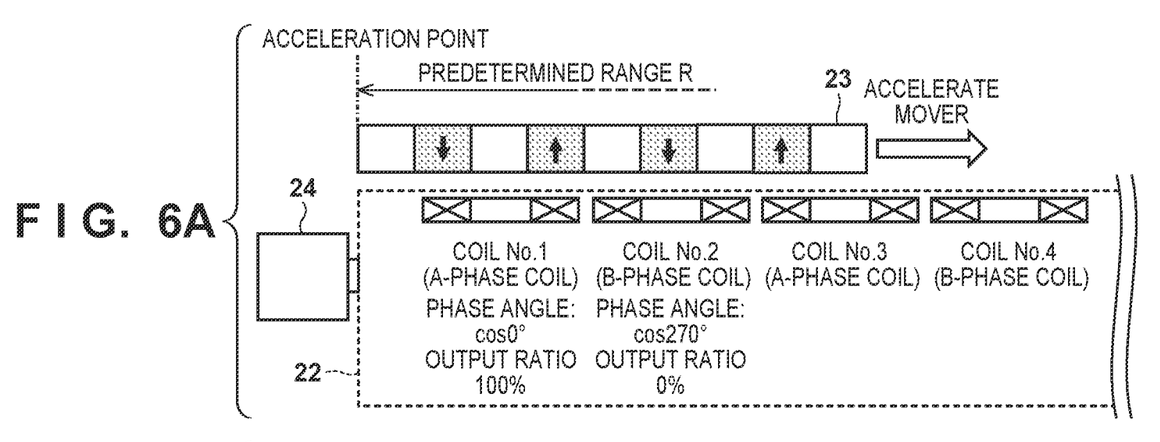
FIGS. 6A and 6B are views for explaining an example of the moving process of the stator.
Figure 6B:
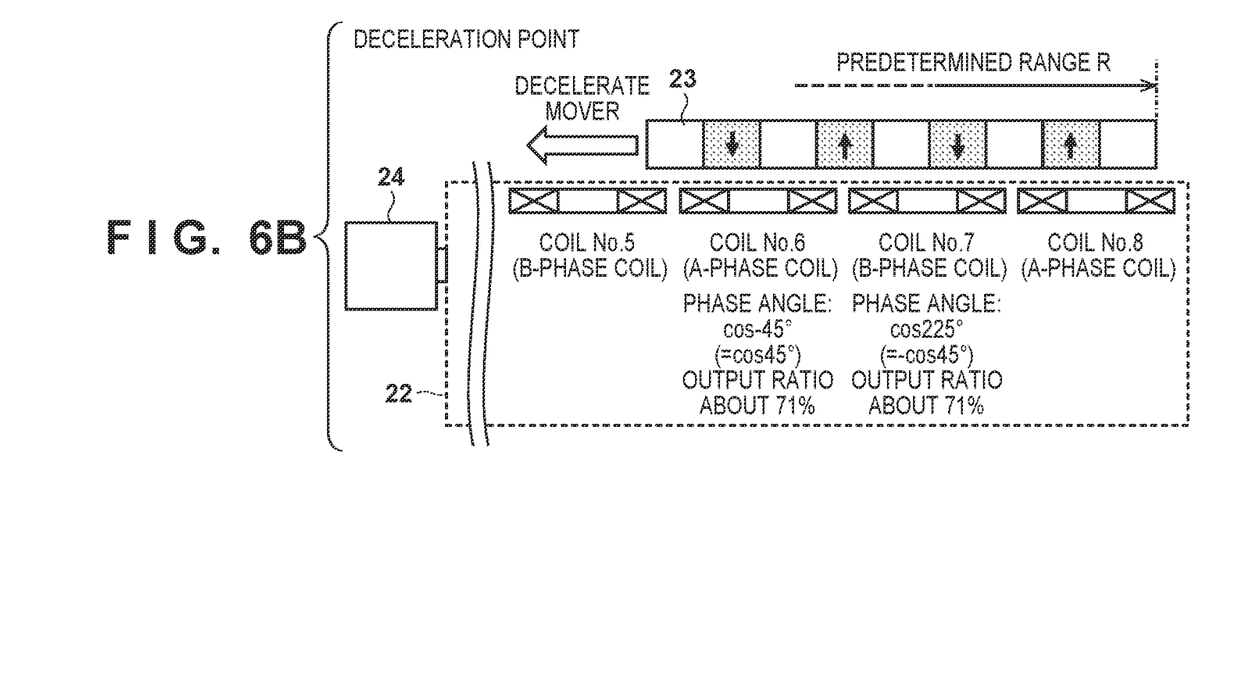
Figure 7A:
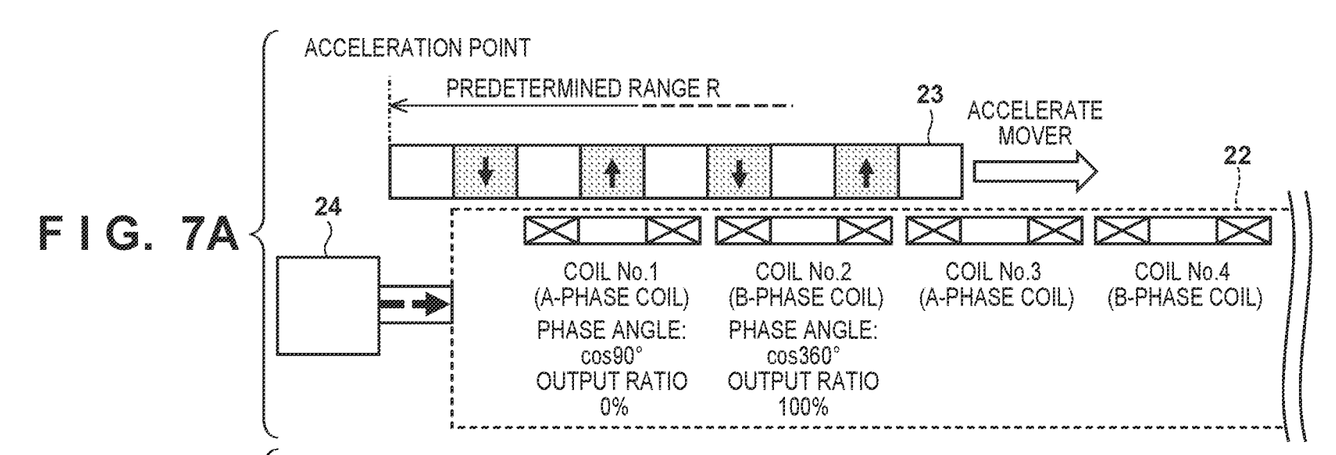
FIGS. 7A and 7B are views for explaining the example of the moving process of the stator.
Figure 7B:
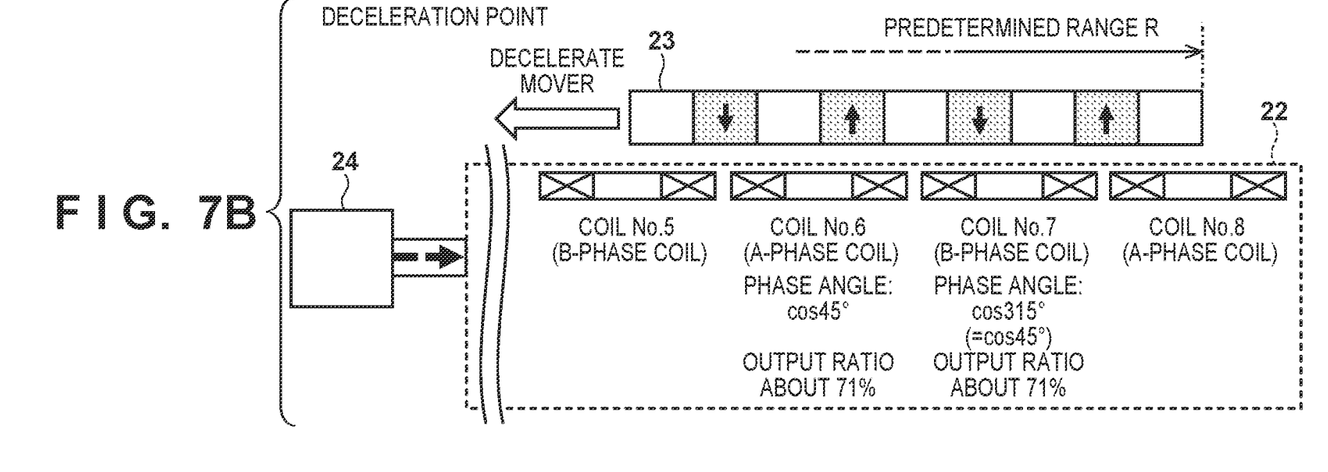

FIGS. 6A to 7B are views for explaining an example of the moving process of the stator 22, and show the positional relationship between the stator 22 (coils 22a) and the mover 23 (permanent magnets 23a) at each of the acceleration point and the deceleration point. FIGS. 6A and 6B show the positional relationship between the stator 22 and the mover 23 before performing the moving process of the stator 22, and FIGS. 7A and 7B show the positional relationship between the stator 22 and the mover 23 after performing the moving process of the stator 22. Note that FIGS. 6A to 7B show a case in which the multi-phase linear motor 21 performs two-phase excitation (A-phase and B-phase).

FIGS. 6A and 6B show an example of the positional relationship between the stator 22 (coils 22a) and the mover 23 (permanent magnets 23a) before performing the moving process of the stator 22. FIG. 6A shows the positional relationship between the stator 22 and the mover 23 at the point A where the mover 23 is accelerated in the predetermined range R, and FIG. 6B shows the positional relationship between the stator 22 and the mover 23 at the point B where the mover 23 is decelerated in the predetermined range R.

In the example shown in FIG. 6A, the A-phase coil and B-phase coil used to accelerate the mover 23 at the point A are the coil No. 1 and coil No. 2, respectively. In this case, in the coil No. 1 (A-phase coil), since the phase angle is 0°, a (maximum driving current value)×cos(0°)=α holds. Thus, when starting acceleration of the mover 23, the maximum current is applied (supplied) to the coil No. 1. In the coil No. 2 (B-phase coil), since the phase angle is 270°, α−cos(270°)=0 holds. Thus, when starting acceleration of the mover 23, no current is applied (supplied) to the coil No. 2.

On the other hand, in the example shown in FIG. 6B, the A-phase coil and B-phase coil used to decelerate (stop) the mover 23 at the point B are the coil No. 6 and coil No. 7, respectively. In this case, in the coil No. 6 (A-phase coil), since the phase angle is −45°, a current of α×cos(−45°)=1/√2×α is applied, and a deceleration force is generated in the mover 23. In the coil No. 7 (B-phase coil), since the phase angle is 225°, similar to the coil No. 6 (A-phase coil), a current of α×cos (225°)=−1/√2×α is applied, and a deceleration force is generated in the mover 23.

Here, at the point B (deceleration point), since the output ratio of the coil No. 6 (A-phase coil) is equal to that of the coil No. 7 (B-phase coil), the current load can be distributed between these coils. On the other hand, at the point A (acceleration point), a large current load is applied to the coil No. 1 (A-phase coil) alone. That is, if the operation (driving process) as described above is repeatedly performed, the biased current load is continuously applied to the coil No. 1 (A-phase coil). To prevent this, in the driving apparatus 20 of this embodiment, as has been described above, the position of the stator 22 with respect to the predetermine range R is changed by the moving mechanism 24 at an arbitrary timing and, in accordance with the change of the position of the stator 22, the output ratios of the plurality of coils 22a in the driving process are changed.

FIGS. 7A and 7B shows an example of the positional relationship between the stator 22 (coils 22a) and the mover 23 (permanent magnets 23a) after performing the moving process of the stator 22. FIG. 7A shows the positional relationship between the stator 22 and the mover 23 at the point A where the mover 23 is accelerated in the predetermined range R, and FIG. 7B shows the positional relationship between the stator 22 and the mover 23 at the point B where the mover 23 is decelerated in the predetermined range R Here, an example is shown in which, as the moving process of the stator 22, the position of the stator 22 with respect to the predetermined range R is changed by the moving mechanism 24 such that the phase angle between the stator 22 and the mover 23 is changed by 90°, that is, the position of the stator 22 is changed by the distance corresponding to the phase angle of 90°. For example, the distance corresponding to the phase angle of 90° may be understood as the distance of one pole dimension of the plurality of permanent magnets 23a in the mover 23, or may be understood as a distance of half the array pitch of the plurality of permanent magnets 23a. Note that the change amount of the position of the stator 22 by the moving mechanism 24 is not limited to the distance corresponding to the phase angle of 90° as long as the output ratios of the plurality of coils 22a in the acceleration and/or deceleration of the mover 23 change.

In the example shown in FIG. 7A, the A-phase coil and B-phase coil used to accelerate the mover 23 at the point A are the coil No. 1 and coil No. 2, respectively. However, in this case, in the coil No. 1 (A-phase coil), since the phase angle is changed to 90°, α−cos(90°)=0 holds. Thus, when starting acceleration of the mover 23, no current is applied (supplied) to the coil No. 1. In the coil No. 2 (B-phase coil), since the phase angle is changed to 3600, αxcos(360°)=a holds. Thus, when starting acceleration of the mover 23, the maximum current is applied (supplied) to the coil No. 2. That is, in the example shown in FIG. 7A, the phase angle of the coil No. 1 and the phase angle of the coil No. 2 are interchanged as compared with the example shown in FIG. 6A, so that the output ratios of the plurality coils 22a in the stator 22 can be changed.

On the other hand, in the example shown in FIG. 7B, the A-phase coil and B-phase coil used to decelerate (stop) the mover 23 at the point B are the coil No. 6 and coil No. 7, respectively. In this case, in the coil No. 6 (A-phase coil), since the phase angle is 45°, a current of αxcos(45°)=1/√2×α is applied, and a deceleration force is generated in the mover 23. In the coil No. 7 (B-phase coil), since the phase angle is 315°, similar to the coil No. 6 (A-phase coil), a current of αxcos (315°)=1/√2×α is applied, and a deceleration force is generated in the stator 23.

As has been described above, at the acceleration point (point A) shown in FIGS. 6A and 7A, the phase angle of the coil No. 1 and the phase angle of the coil No. 2 after the moving process of the stator 22 are interchanged with respect to those before the moving process. Thus, the output ratios of the plurality of coils 22a in the stator 22 after the moving process can be determined so as to be changed with respect to those before the moving process. Accordingly, the current load time of the coil No. 1 and that of the coil No. 2 are averaged. This can decrease the bias of the current load, so that the local deterioration in the stator 22 can be reduced. On the other hand, at the deceleration point (point B) shown in FIGS. 6B and 7B, the current load on the coil No. 6 is equal to the current load on the coil No. 7 both before and after the moving process of the stator 22. Accordingly, also at the deceleration point, the bias of the current load can be decreased, so that the local deterioration in the stator 22 can be reduced.

Here, in the moving process of the stator 22 described with reference to FIGS. 6A to 7B, the output ratios of the plurality of coils 22a at the deceleration point (point B) are not changed. However, instead of or in addition to the acceleration point, the output ratios of the plurality of coils 22a at the deceleration point may be changed. For example, at an arbitrary timing, the position of the stator 22 with respect to the predetermined range R may be changed by the moving mechanism 24 such that the output ratios of the plurality of coils 22a at the deceleration point (point B) are changed instead of or in addition to the acceleration point (point A).

Figure 8:
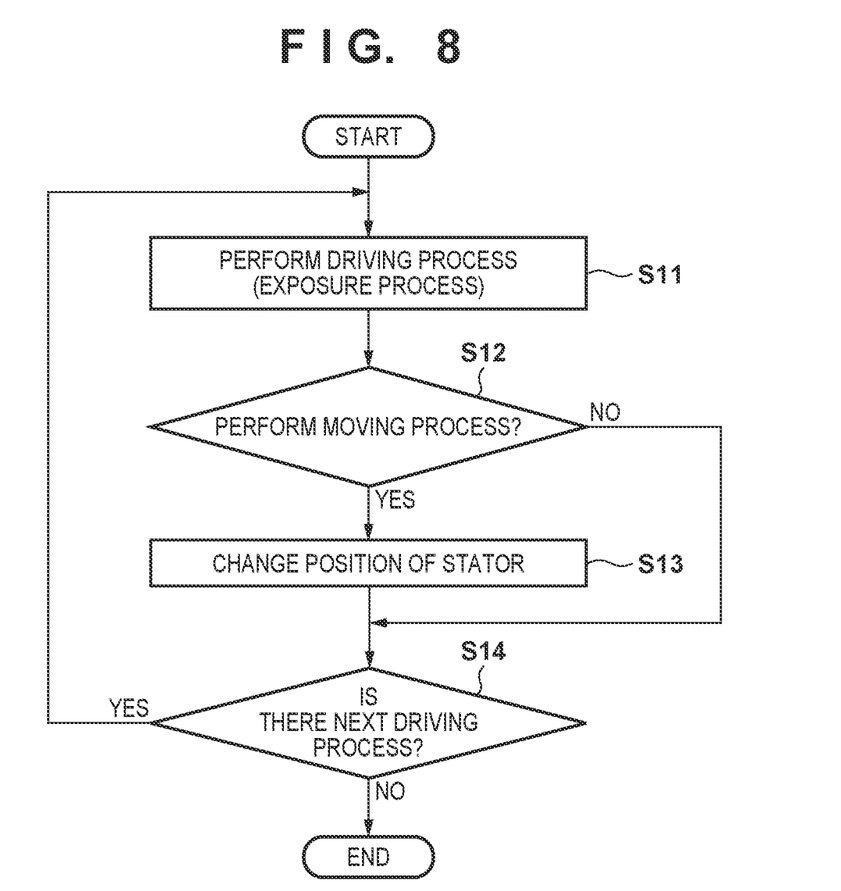
FIG. 8 is a flowchart illustrating an operation example of the driving apparatus.

Next, an operation of the driving apparatus 20 of this embodiment will be described. FIG. 8 is a flowchart illustrating an operation example of the driving apparatus 20 of this embodiment. Here, the operation of the driving apparatus 20 in a case in which the driving apparatus 20 is applied to the exposure apparatus 10 described above will be described. Each step in the flowchart of FIG. 8 can be performed by the controller 25.

In step S11, the controller 25 performs the driving process of driving the original stage 13 by the multi-phase linear motor 21. This driving process may be understood to correspond to the exposure process on one shot region in the substrate S. Then, in step S12, the controller 25 determines whether to change the position of the stator 22, that is, whether to perform the moving process of the stator 22. For example, as has been described above, based on the number of driving operations of the original stage 13, the value of each of the various kinds of sensors, or the like, the controller 25 can determine whether it is the timing to perform the moving process of the stator 22. If it is determined that the moving process of the stator 22 is performed, the process advances to step S13. If it is determined that the moving process of the stator 22 is not performed, the process advances to step S14.

In step S13, the controller 25 performs the moving process of the stator 22 by changing the position of the stator 22 with respect to the predetermined range R by the moving mechanism 24. For example, as described above, the controller 25 changes the position of the stator 22 by the moving mechanism 24 such that the output ratios of the plurality of coils 22a at the acceleration point and/or the deceleration point after the moving process of the stator 22 are changed with respect to those before the moving process. Then, in the stator 22 whose position has changed by the moving mechanism 24, the output ratios of the plurality of coils 22a in the stator 22 are changed such that the mover 23 can be driven in the predetermined range R.

In step S14, the controller 25 determines whether to continue to perform the driving process, that is, whether the next driving process is performed. This step S14 may be understood as a step of determining whether there is a shot region to undergo the exposure process next. The shot region to undergo the exposure process next may be, for example, a shot region, among the plurality of shot regions in the substrate S, where the exposure process has not been performed, or may be a shot region of a substrate where the exposure process has not been performed in a lot including a plurality of the substrates S. If the next driving process is performed, the process advances to step S11. If the next driving process is not performed, the process is terminated. In this manner, the moving process of the stator 22 can be performed in a period between the driving process and the next driving process.

As has been described above, the driving apparatus 20 of this embodiment changes the position of the stator 22 with respect to the predetermined range R by the moving mechanism 24 at an arbitrary timing. Then, in accordance with the change of the position of the stator 22, the output ratios of the plurality of coils 22a in the driving process after the arbitrary timing are determined so as to be changed with respect to the output ratios of the plurality of coils 22a before the arbitrary timing. With this process, it is possible to decrease the bias of the current loads on the plurality of coils 22a in the stator 22, so that the local deterioration in the stator 22 can be reduced. Here, the two-phase excitation driving type linear motor is used as the multi-phase linear motor 21 in this embodiment, but the present invention is not limited to this. An excitation driving type linear motor of three or more phases may be used. Further, in this embodiment, a moving magnet type linear motor is used as the multi-phase linear motor 21, but a moving coil type linear motor may be used.

Embodiment of Method of Manufacturing Article

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern on a substrate by using the above-described lithography apparatus (exposure apparatus), and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-113134 filed on Jul. 7, 2021, which is hereby incorporated by reference herein in its entirety.

What is claimed is:

1. A control method of a driving apparatus that repeatedly performs a process of driving a target object in a predetermined range by a linear motor, wherein the linear motor includes a stator in which a plurality of coils are arrayed, and a mover provided with the target object, the control method comprising:
   changing a position of the stator with respect to the predetermined range at an arbitrary timing; and
   determining, in accordance with the changed position of the stator, output ratios of the plurality of coils in the process,
   wherein the arbitrary timing includes at least one of:
      a timing at which the number of driving operations of the target object reaches a first threshold value;
      a timing at which a temperature of the linear motor reaches a second threshold value;
      a timing at which an electric characteristic of at least one of the plurality of coils reaches a third threshold value, the electric characteristic including at least one of a resistance value, a voltage value, a current value and an inductance value; and
      a timing at which a difference between a measurement value indicating a driving state of the target object and a target value reaches a fourth threshold value, the driving state including at least one of a velocity, an acceleration and a position.

2. The method according to claim 1, wherein
   at the arbitrary timing, the position of the stator with respect to the predetermined range is changed such that a phase angle between the stator and the mover is changed by 90°.

3. The method according to claim 1, wherein
   the mover includes a plurality of magnets arrayed along an array direction of the plurality of coils, and
   at the arbitrary timing, the position of the stator with respect to the predetermined range is changed by a distance of half an array pitch of the plurality of magnets.

4. The method according to claim 1, wherein
   the linear motor is a multi-phase excitation driving type linear motor.

5. A driving apparatus that drives a target object, comprising:
   a linear motor that comprises a stator in which a plurality of coils are arrayed, and a mover provided with the target object;
   a moving mechanism configured to move the stator along an array direction of the plurality of coils; and
   a controller configured to repeatedly control a process of driving the target object in a predetermined range by the linear motor,
   wherein the controller is configured to change a position of the stator with respect to the predetermined range by the moving mechanism at an arbitrary timing, and determine, in accordance with the changed position of the stator, output ratios of the plurality of coils in the process, and
   wherein the arbitrary timing includes at least one of:
      a timing at which the number of driving operations of the target object reaches a first threshold value;
      a timing at which a temperature of the linear motor reaches a second threshold value;
      a timing at which an electric characteristic of at least one of the plurality of coils reaches a third threshold value, the electric characteristic including at least one of a resistance value, a voltage value, a current value and an inductance value; and
      a timing at which a difference between a measurement value indicating a driving state of the target object and a target value reaches a fourth threshold value, the driving state including at least one of a velocity, an acceleration and a position.

6. A lithography apparatus that forms a pattern on a substrate, comprising
   a driving apparatus defined in claim 5,
   wherein the driving apparatus drives, as a target object to be driven, a stage that holds the substrate or an Original including a pattern to be transferred onto the substrate.

7. A method of manufacturing an article, the method comprising:

forming a pattern on a substrate by using a lithography apparatus according to claim 6; and processing the substrate, on which the pattern has been formed, to manufacture the article.

\* \* \* \* \*